United States Patent [19]

Dentino et al.

[11] 4,207,624

[45] Jun. 10, 1980

[54] FREQUENCY DOMAIN ADAPTIVE FILTER FOR DETECTION OF SONAR SIGNALS

[75] Inventors: Mauro J. Dentino, Placentia; Harry M. Huey, Anaheim; Toni Letendre, Placentia, all of Calif.

[73] Assignee: Rockwell International Corporation, El Segundo, Calif.

[21] Appl. No.: 948,175

[22] Filed: Oct. 2, 1978

[51] Int. Cl.$^2$ .............................................. H04B 1/10
[52] U.S. Cl. .................................... 367/135; 367/901; 364/724; 364/726; 343/5 FT
[58] Field of Search ...... 340/5 R, 6 R, 3 M, 15.5 AF; 343/5 FT; 364/724, 517, 725, 726

[56] References Cited

U.S. PATENT DOCUMENTS

| | | | |
|---|---|---|---|
| 3,889,108 | 6/1975 | Cantrell | 364/724 |
| 4,063,549 | 12/1977 | Beretsky et al. | 364/726 |
| 4,112,430 | 9/1978 | Ladstatter | 340/6 R |

*Primary Examiner*—Richard A. Farley

*Attorney, Agent, or Firm*—H. Fredrick Hamann; Rolf M. Pitts; Edward A. Sokolski

[57] ABSTRACT

An adaptive filter for sonar signals which operates on the complex spectral components of the received signal, which signal has been transformed into the frequency domain by means such as the Fast Fourier Transform. The adaptive filter consists of a plurality of component filters, each of which operates on a single spectral component of the received signals. The transfer coefficient of each component filter is described by a complex number and is adaptively adjusted by means of a computational feedback loop. The feedback loop compares the product of the transfer coefficient and the complex spectral component of the received signal from a prior frequency transformation cycle, with the present spectral component to obtain an error signal. The error signal, in turn, adaptively alters the magnitude and phase of the transfer coefficient.

A plurality of such component filters operate together to adaptively filter, in the frequency domain, the entire spectrum of the received signal.

6 Claims, 3 Drawing Figures

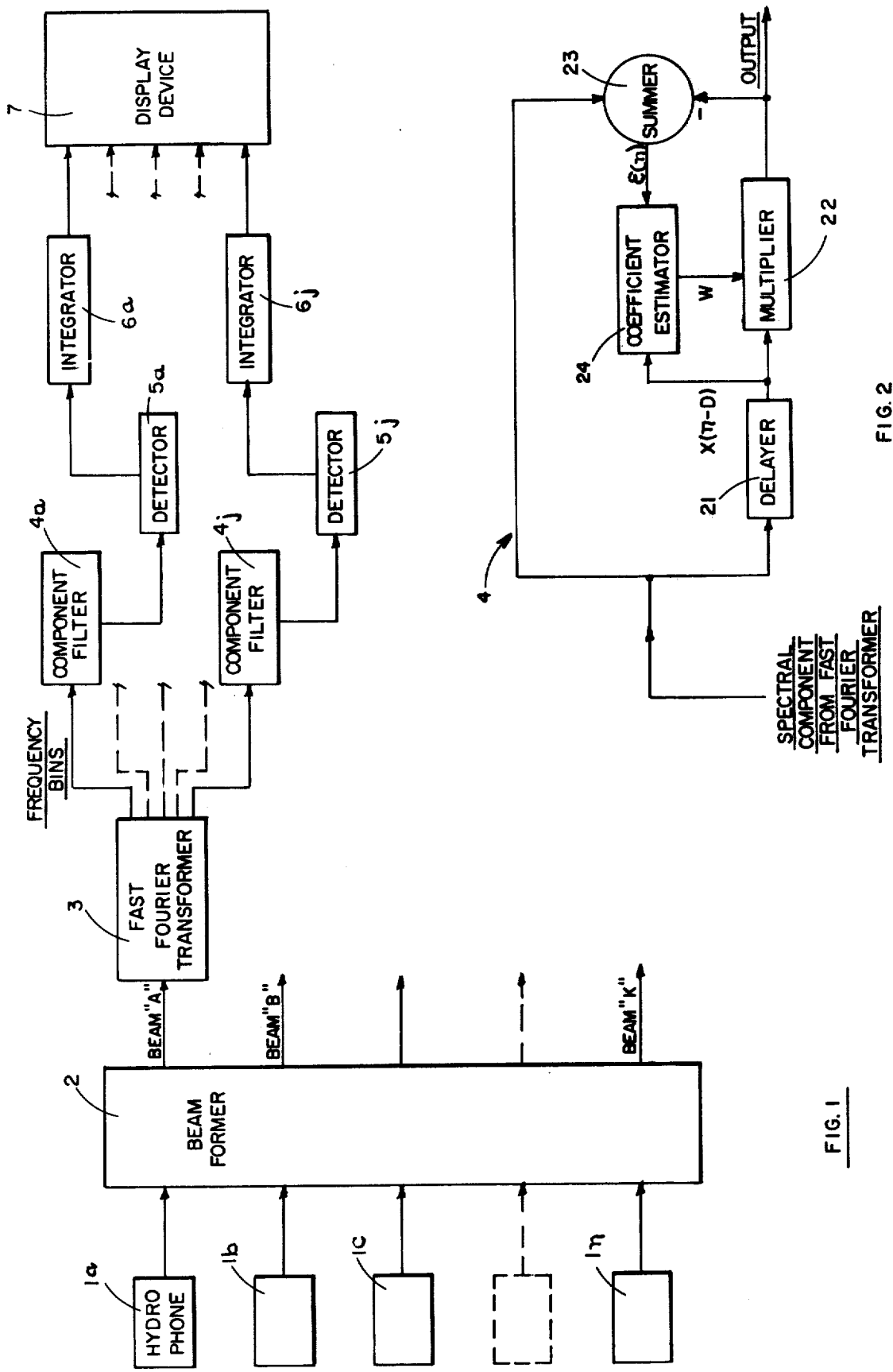

FREQUENCY DOMAIN ADAPTIVE FILTER FOR DETECTION OF SONAR SIGNALS

The invention herein described was made in the course of or under a contract or subcontract thereunder with the Department of the Navy.

BACKGROUND OF THE INVENTION

1. Field of Invention

This invention relates to a frequency domain adaptive filter and more particularly to the use of such a filter for processing and filtering sonar signals following reception.

2. Description of Prior Art

The use of adaptive filters in analog systems which operate in the time domain has been described in a chapter by B. Widrow which appears on pages 563–587 of ASPECTS OF NETWORK AND SYSTEM THEORY, edited by R. E. Kalman and N. DeClaris, published by Holt, Rinehart & Winston, Inc., New York, N.Y., in 1970. Widrow's adaptive filter operates in an analog system and in the time domain. Widrow's filter utilizes a multi-tapped delay line with adjustable weighting from each of the taps to approximate the desired filter response. The accuracy to which the desired response can be approximated is limited by the number of taps on the delay line and the ability to weight the output from each tap. The mechanization of a filter of the Widrow type, containing a significant number of degrees of freedom so that the desired response can be clsely approximated is both mechanically and electrically cumbersome.

The system of the present invention avoids the electrical and mechanical problems associated with an analog filter of the Widrow type by utilizing a digital processing technique which operates in the frequency domain to simplify the adaptive filtering process.

BRIEF SUMMARY OF THE INVENTION

The system of this invention is a system for receiving, detecting and displaying sonar signals which utilizes an adaptive filter operating on sonar signals which have been transformed into the frequency domain following reception. The system includes digital transformer means for transforming the input signal from the time domain into the frequency domain. Such transformer means typically are mechanized by the application of the digital, Fast Fourier Transform.

In the system of this invention, following reception by one or more hydrophones, the input sonar signal is converted from analog to digital form. In a system containing more than one hydrophone, the outputs of the hydrophones are combined to form one or more beams, that is, to generate one or more outputs, each of which exhibits a higher sensitivity to sonar signals received from a particular direction. The system of this invention operates on one of these beams or outputs or in the case of a single hydrophone, on its output alone. The Fast Fourier Transform then is applied to the data output for one beam during a given interval of time, to calculate the complex frequency components in the received signal for each successive interval of time. The adaptive filter of this invention operates on the spectral components of the transformed signal.

The adaptive filter consists of a plurality of component filters, each of which operates on a single spectral component of the received signals. The transfer coefficient of the component filter, which is described by a complex number, is adaptively adjusted by means of a computational feedback loop. The complex spectral component is input to the component filter where it is delayed for one or more processing cycles of the Fast Fourier Transformer. The component filter then multiplies the delayed component by the component filter transfer coefficient, and compares that product with the complex spectral component for the same frequency from the present transformer processing cycle. The comparison generates an error signal which is used to alter the magnitude and phase of the transfer coefficient of the component filter.

When the complex spectral component for each processing cycle is uncorrelated with the spectral components for the same frequency from successive processing cycles, the transfer coefficient of the component filter decays towards zero. When the successive spectral coefficients are highly correlated, the component filter transfer coefficient approaches 1 in magnitude with a phase that compensates for the delay of one processing cycle.

A plurality of such component filters operating at each of the frequencies in the output from the Fast Fourier Transformer provides adaptive filtering of the entire received sonar signal.

BRIEF DESCRIPTION OF DRAWINGS

FIG. 1 is a block diagram of a preferred embodiment of the invention;

FIG. 2 is a functional block diagram which illustrates a preferred embodiment of the component filter of the invention.

DETAILED DESCRIPTION

Figure 3:
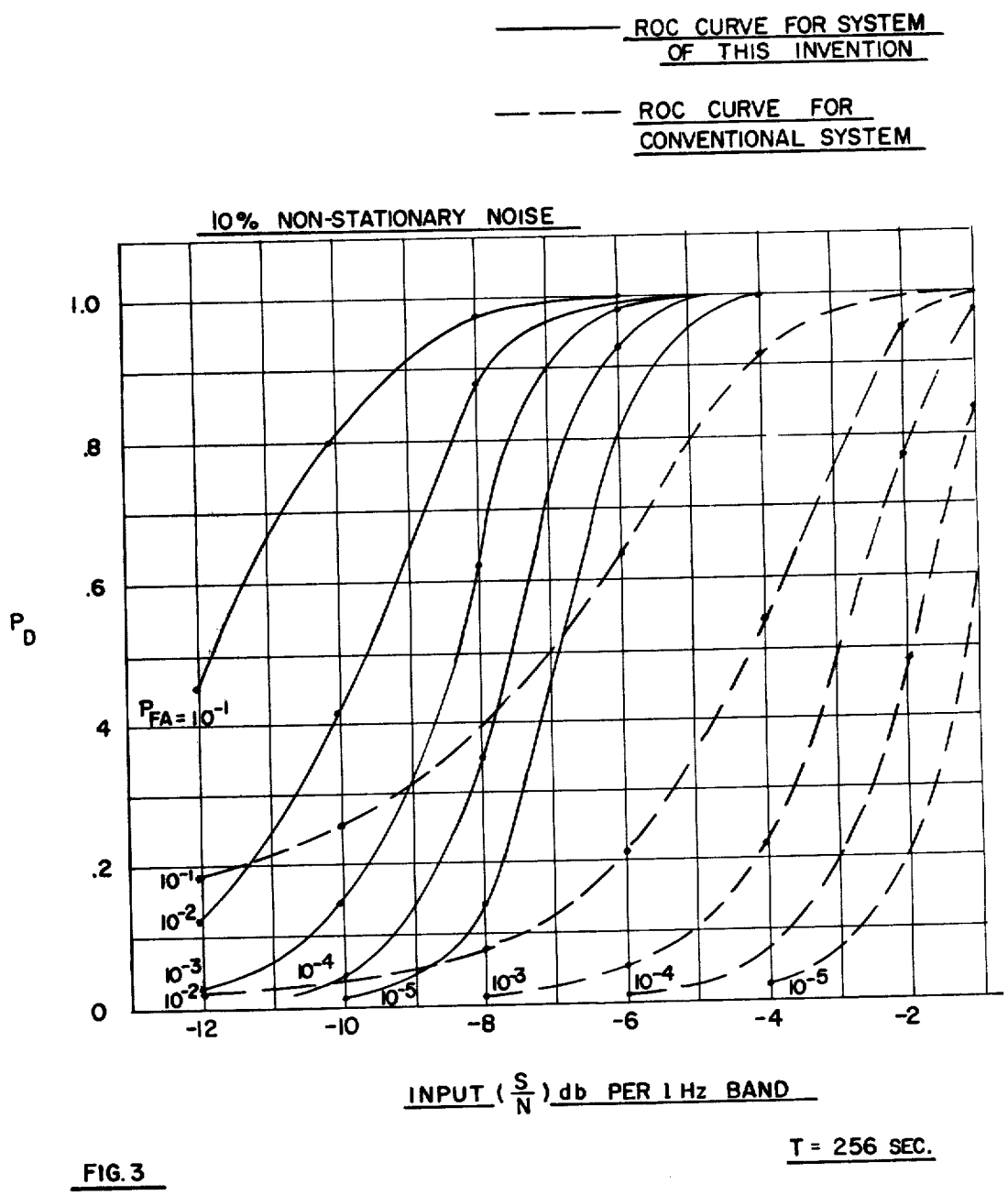
FIG. 3 is a graph comparing the performance of the system of this invention with a conventional detection system.

Referring to FIG. 1, sonar signals are received by a plurality of hydrophones or transducers $1a$ through $1n$ which convert the received sonic signals into electrical signals. In the best mode, each hydrophone converts the received signals into digital form. The conversion of the received signals into a digital format, however, can be performed at any point in the invention prior to the input of the data into Fast Fourier Transformer 3. In the best mode, the outputs from the hydrophones $1a$–$1n$ pass to beamformer 2, which combines the signals to form one or more beams A–K. Each "beam" is the result of combining the outputs from the hydrophones so as to emphasize signals arriving from a particular direction and to de-emphasize signals arriving from other directions. The system of this invention also can operate on the output from a single hydrophone, but better performance is obtained when the outputs of a number of hydrophones are combined to provide directional sensitivity. Each output from the beamformer 2 then passes to a Fast Fourier Transformer 3 which transforms the digital signal from the time demain into the frequency domain by means of the Fast Fourier Transform. As is well known in the art, the Fast Fourier Transformer can be mechanized by means of a general or special purpose computer programmed to execute the Fast Fourier Transform algorithm such as the algorithm described in an article by James W. Cooley and John W. Tukey which appears on pages 297–301 of MATHEMATICS OF COMPUTATION, Volume 19, No. 90, published by The American Mathematical Society in 1965.

The temporal data which represents the sonar signals received during successive predetermined segments of time are converted into successive sets of complex frequency components and output in separate frequency "bins", a–j. The time interval occupied by one such set of data corresponds to the time occupied by one processing cycle of the Fast Fourier Transformer. Thus, the Fast Fourier Transformer 3 outputs successive sets of complex frequency or "spectral" components. The number of components in each set is determined by the bandwidth of the system and the frequency resolution of the transformer. In a conventional system spectral component "a" would then go directly to a detector 5a without passing through the frequency domain component filter 4a, which is used in the present invention. The detector 5a measures the absolute magnitude of the spectral component. The output of the detector 5a is integrated by integrator 6a to reduce the noise in the system and the output of the integrator 6a then goes to a display device 7 which displays, in one manner or another, the integrated magnitudes of the spectral components a–j from one of the beams generated by the beamformer 2. Each of the spectral components a–j is processed in a similar manner by detectors 5a–5j and integrators 6a–6j.

In the system of the present invention, frequency domain component filters 4a–4j referred to herein as the "component filters", are inserted so as to operate on each of the spectral components output by the Fast Fourier Transformer 3 prior to the input of this data to the detectors 5a–5j.

Referring now to FIG. 2 which is a functional block diagram illustrating the operation of the component filter 4a, a spectral component of the received signal which is an output from the Fast Fourier Transformer enters the component filter and is divided into two parts. One part enters delayer 21 and is delayed for one (or more) periods of time corresponding to one (or more) data processing cycles of the Fast Fourier Transformer. The delayed data is fed from the delayer 21 to coefficient estimator 24 and also into multiplier 22 where the delayed data is multiplied by a weighting function W. This weighting function is generated by the coefficient estimator 24 which is described further on in the specification. The product of this weighting function and the delayed data constitutes the output, O(n), from the component filter, i.e., $$O(n) = W(n) \cdot X(n-D) \tag{1}$$

where $X(n-D)$ is the input to the adaptive filter delayed by "D" operating cycles.

Thus the complex transfer coefficient of the component filter is the product of the weight function W, and a complex coefficient of unity magnitude which represents the delay introduced by delayer 21.

The output of the multiplier 22 also is fed to summer 23. As described above, the input to the component filter is divided into two parts, the second part of which goes directly to summer 23. The output of summer 23 is an error signal which is the difference between its inputs, i.e., the difference between the output of the component filter, which is a function of the input to the component filter during a previous operating cycle, and the input to the component filter for the current processing cycle of the Fast Fourier Transformer. Accordingly, the error signal, $\epsilon(n)$, is given by:

$$\epsilon(n) = X(n) - X(n-D) \cdot W(n) \tag{2}$$

where $X(n)$ represents the spectral component, X, from the output of the Fast Fourier Transformer for the "nth" operating cycle; D is the delay, in terms of operating cycles, that is introduced by delayer 21; and $W(n)$ is the weighting function that is output by coefficient estimator 24 for the "nth" operating cycle.

The error signal generated by summer 23 is input to coefficient estimator 24, which in turn calculates an updated value for the weighting cofficient W, which is output to multiplier 22.

The coefficient estimator 24 is mechanized by means of a general or special purpose computer such as the AP120B manufactured by Floating Point Corp., Seattle, Washington, which has been programmed in accordance with the following algorithm:

$$W(n+1) = W(n) + \mu\epsilon(n) \cdot X^*(n-D) \tag{3}$$

where * indicates a complex conjugation operation and $X^*(n-D)$ is the complex conjugate of the spectral component generated by the Fast Fourier Transformer for the processing cycle which occurred "D" cycles previously.

Delayer 21 feeds $X(n-D)$ into coefficient estimater 24 which, in turn, computes the complex conjugate, $X^*(n-D)$. $\mu 0$ is a real feedback constant that controls the response of the system and is preset to a value much less than one. The actual value depends upon the rate of learning required of the adaptive loop. The learning response time, $\tau_A$, is given by the relationship $$\tau_A = \frac{T}{2\mu P} \tag{4}$$

where T is the length of time occupied by one processing cycle of the Fast Fourier Transformer and P is the total of the signal and noise power represented by the signal component.

In an operative embodiment, $\mu P$ may be between 0.001 and 0.005, but especially slow or rapid learning rates will require other values of $\mu$. In practice, the entire adaptive correlator is mechanized by means of a single general or special purpose computer which performs the operations represented by Equations 1, 2 and 3.

In operation the expected value of the complex weight function, $W(n)$, converges to the estimate of the complex normalized correlation coefficient of the spectral components for the particular frequency for a relative relay of D, that is, $$E[W(n=\text{large})] \rightarrow \rho(D) \tag{5}$$

where $$\rho(D) = \frac{E[X(n) X^*(n-D)]}{E[X(n) X^*(n)]} \tag{6}$$

When noise only is present in the input to the system, the spectral components from two non-overlapping Fast Fourier Transformer operations will be uncorrelated. As a consequence, the expected value of W is zero when only noise is present, that is:

$$\rho(D) = \frac{E[X(n) X^*(n-D)]}{E[X(n) X^*(n)]} = 0 \tag{7}$$

However, when a coherent spectral component is present in the output of the Fast Fourier Transformer, the expected magnitude of the weighting function will approach a value between zero and 1, given by:

$$\rho(D) = \frac{E[S(n) S^*(n-D)]}{P_S + P_n} \neq 0 \tag{8}$$

where $E[S(n) S^*(n-D)]$ is the relative complex correlation between the narrow band spectral components for operating cycles that are D operating cycles apart, $P_S$ = the signal power, and
$P_n$ = the noise power Thus, the component filter with weight function, (W(n)), acts as an automatic gain control whose transfer function approaches unity, when strong signals are present at the particular component frequency and whose transfer function decays towards zero when only noise is present. The result is an improvement in the detection capability when a plurality of component filters are incorporated into a conventional sonar processing system because the insertion of the component filters increases the spread, between the statistical probability density functions in the output of the system for inputs of noise only, and for signal plus noise, in comparison to the spread in conventional systems.

The improvement in performance exhibited by the system of this invention over a conventional system is illustrated in FIG. 3. The Receiver Operator Characteristic Curves (ROC) are plotted which show the probability of detection, $P_D$, for the two systems, for various probabilities of false alarm, $P_{FA}$. The comparison was made for 10% non-stationary noise (which is typical for a sonar-like environment), a Fourier transform cycle that yields spectral components at 1 hertz intervals, and an adaptation time of 256 seconds.

We claim:

1. A system for processing received sonar signals comprising:
    receiving and beamforming means for receiving the sonar signals and for converting the received sonar signals into digital data,
    transformer means for transforming the digital data from the time domain which transformer means is connected to the output of the receiving and beam forming means,
    a plurality of component filter means forming an adaptive filter for adaptively filtering the data in the frequency domain, connected to the output of the transformer means,
    a plurality of detector means for obtaining the absolute magnitude of each of the outputs of the component filter means,
    a plurality of integrator means for integrating the outputs of each of the detector means, and
    displayer means connected to the outputs of the integrator means for displaying the processed data.

2. The system defined in claim 1 wherein the component filter means comprises:
    delayer means for delaying in time the data received from the transformer means,
    coefficient estimator means for generating and periodically modifying a weighting function,
    multiplier means for multiplying the output of the delayer means together with the weighting function output by the coefficient estimator means to provide the output from the adaptive filter means,
    summer means for obtaining the difference between the output of the component filter means and the data in the frequency domain that is input to the component filter means and inputting the difference to the coefficient estimator means.

3. The system defined in claim 1 wherein the component filter means comprises a computer programmed in accordance with the following algorithms:

$$O(n) = W(n) \cdot X(n-D)$$

$$\epsilon(n) = X(n) - X(n-D) \cdot W(n)$$

$$W(n+1) = \mu \epsilon(n) \cdot X^*(n-D)$$

where $O(n)$ is the output of the component filter, $X(n)$ is the input to the component filter, $W(n)$ is a weighting function generated within the component filter for the "nth" operating cycle, $X(n-D)$ is the input to the adaptive filter delayed by "D" operating cycles, $W(n+1)$ is the weighting function for the "(n+1)th" operating cycle, $\epsilon(n)$ is an error signal generated within the component filter, $\mu$ is a predetermined feedback constant, and $X^*(n-D)$ is the complex conjugate of the term $X^*(n-D)$.

4. A method for facilitating the identification of sources of sonar signals received by hydrophone means which comprises:
    converting the output of the hydrophone means into digital data,
    transforming the digital data from the time domain into the frequency domain to obtain the complex frequency components of the received signals,
    adaptively filtering the complex frequency components to obtain the filtered frequency components,
    detecting the filtered frequency components to obtain the absolute magnitude of the components,
    integrating the absolute magnitudes of the filtered frequency components to reduce the statistical fluctuations in the absolute magnitudes of the components,
    and displaying the integrated components to enable the identification of the sources of the sonar signals.

5. The method defined in claim 4 wherein the step of adaptively filtering comprises:
    delaying in time each complex frequency component,
    multiplying each delayed complex frequency component with a weighting function to obtain a filtered frequency component,
    subtracting each filtered frequency component from the undelayed and unfiltered complex frequency component for each frequency to obtain an error signal for each frequency component,
    and multiplying each error signal by a preselected constant and by the complex conjugate of the delayed, complex frequency component for each frequency, and adding thereto the current value of the weighting function for each frequency to obtain the new value of the weighting function for each frequency.

6. The method defined in claim 4 wherein the step of adaptively filtering comprises:
    computing the filtered component for each frequency in accordance with the following algorithms:

$$O(n) = W(n) \cdot X(n-D)$$

$$\epsilon(n) = X(n) - X(n-D) \cdot W(n)$$

$$W(n+1) = W(n) + \mu \epsilon(n) \cdot X^*(n-D)$$

where for each frequency $O(n)$ is the output, $X(n)$ is a computed weighting function, $X(n-D)$ is the delayed, transformed data, $X^*(n-D)$ is the complex conjugate of the delayed, transformed data, $W(n+1)$ is the computed weighting function for the "(n+1)th" operating cycle, $\epsilon(n)$ is the difference between the transformed data and the delayed, multiplied data, and $\mu$ is a predetermined feedback constant.

* * * * *